(12) United States Patent
Xiong et al.

(10) Patent No.: US 11,439,016 B2
(45) Date of Patent: Sep. 6, 2022

(54) POWER CONVERTER MODULE

(71) Applicant: Delta Electronics, Inc., Taoyuan (TW)

(72) Inventors: Yahong Xiong, Taoyuan (TW); Cheng Cheng, Taoyuan (TW); Junguo Cui, Taoyuan (TW); Shengli Lu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 12 days.

(21) Appl. No.: 17/147,504

(22) Filed: Jan. 13, 2021

(65) Prior Publication Data

US 2022/0132670 A1 Apr. 28, 2022

(30) Foreign Application Priority Data

Oct. 27, 2020 (CN) .......................... 202011164463.3
Nov. 9, 2020 (CN) .......................... 202011251395.4

(51) Int. Cl.
| | |
|---|---|
| *H05K 1/18* | (2006.01) |
| *H05K 1/11* | (2006.01) |
| *H05K 1/09* | (2006.01) |
| *H01F 27/24* | (2006.01) |
| *H01F 27/28* | (2006.01) |
| *H02M 3/158* | (2006.01) |

(52) U.S. Cl.
CPC ............ *H05K 1/181* (2013.01); *H01F 27/24* (2013.01); *H01F 27/2804* (2013.01); *H05K 1/09* (2013.01); *H05K 1/115* (2013.01); *H05K 1/185* (2013.01); *H01F 2027/2809* (2013.01); *H02M 3/158* (2013.01); *H05K 2201/1003* (2013.01); *H05K 2201/10166* (2013.01)

(58) Field of Classification Search
CPC .................................................... H05K 1/181
USPC .......................................................... 361/761
See application file for complete search history.

(56) References Cited

U.S. PATENT DOCUMENTS

| | | |
|---|---|---|
| 10,185,141 B2 | 1/2019 | Wang et al. |
| 10,701,795 B2 | 6/2020 | Pando Rodriguez et al. |

(Continued)

FOREIGN PATENT DOCUMENTS

| | | | |
|---|---|---|---|
| CN | 100584144 C | * | 2/2007 |
| CN | 100584144 C | | 1/2010 |
| CN | 108400716 A | | 8/2018 |

(Continued)

*Primary Examiner* — Stanley Tso
(74) *Attorney, Agent, or Firm* — Kirton McConkie; Evan R. Witt

(57) ABSTRACT

A power converter module includes a multilayer printed circuit board, a switching device, a magnetic core element and a winding via. The multilayer printed circuit board has a first surface, a second surface and an inside layer. The multilayer printed circuit board includes a plurality of copper layers. The magnetic core element is disposed in the inside layer and includes a hole. One end of the winding via is electrically connected to the switching device, and the other end of the winding via is electrically connected to the second surface. The winding via penetrates through the hole and forms a magnetic assembly. An amount of the copper layers on a first side of the magnetic core element close to the first surface of the multilayer printed circuit board is at least two more than a second side of the magnetic core element.

10 Claims, 7 Drawing Sheets

(56) References Cited

U.S. PATENT DOCUMENTS

2014/0347825 A1\* 11/2014 Guo ................. H01F 17/06
  361/748
2020/0084878 A1\* 3/2020 Pando Rodriguez ................
  H05K 3/4644

FOREIGN PATENT DOCUMENTS

| CN | 111313655 A | 6/2020 |
| CN | 111357182 A | 6/2020 |

\* cited by examiner

POWER CONVERTER MODULE

CROSS-REFERENCE TO RELATED APPLICATION

This application claims priorities to China Patent Application No. 202011164463.3 filed on Oct. 27, 2020, and China Patent Application No. 202011251395.4 filed on Nov. 9, 2020, the entire contents of which are incorporated herein by reference for all purposes.

FIELD OF THE INVENTION

The present disclosure relates to a power converter module, and more particularly to a power converter module with different amounts of copper layers on both sides of the magnetic core element.

BACKGROUND OF THE INVENTION

With the rapid development of technologies such as mobile communications and cloud computing, high-power power converter modules have been widely used in electronic products. Due to the trend of high power and miniaturization of electronic products, how to improve the conversion efficiency of the power converter module and reduce the size of the power converter module is the primary consideration.

In the conventional power converter module, the magnetic core element is embedded in the multilayer printed circuit board to reduce the volume of the power converter module. For the convenience of the manufacturing process, the amount of the layers of the printed circuit board above the magnetic core element is the same with the amount of the layers of the printed circuit board below the magnetic core element. However, this arrangement may limit the wiring area and copper area above or below the magnetic core element, and increase the difficulty of wiring inside the printed circuit board. In addition, as the wiring length increases, the parasitic loss of the wiring increases, and the interference between signals increases, thereby affecting the conversion efficiency of the power converter module.

Therefore, there is a need of providing a power converter module to obviate the drawbacks encountered from the prior arts.

SUMMARY OF THE INVENTION

It is an object of the present disclosure to provide a power converter module. The magnetic core element of the power converter module is disposed in a multilayer printed circuit board with multiple copper layers, and the amount of the copper layers on one side of the magnetic core element is more than the amount of the copper layers on the other side of the magnetic core element. Therefore, the larger amount of the copper layers concentrated on one side of the magnetic core element can be used to obtain a larger wiring area and copper laying area. Accordingly, enough space for wiring is provided to avoid the strong electromagnetic field interference caused by the power loop. Moreover, the flexibility of the copper laying network is increased, and the parasitic resistance and parasitic inductance of the multilayer printed circuit board are reduced, thereby improving the efficiency of power converter module.

In accordance with an aspect of the present disclosure, there is provided a power converter module. The power converter module includes a multilayer printed circuit board, at least one switching device, at least one magnetic core element and at least one winding via. The multilayer printed circuit board has a first surface, a second surface and an inside layer. The first surface and the second surface are opposite, and the multilayer printed circuit board includes a plurality of copper layers. The switching device is disposed on the first surface of the multilayer printed circuit board. The magnetic core element is disposed in the inside layer of the multilayer printed circuit board, and the magnetic core element has at least one hole. A first end of the winding via is electrically connected to the switching device, and a second end of the winding via is electrically connected to the second surface of the multilayer printed circuit board. The winding via penetrates through the hole of the magnetic core element and forms a magnetic assembly with the magnetic core element. An amount of a part of the plurality of copper layers on a first side of the magnetic core element close to the first surface of the multilayer printed circuit board is at least two more than an amount of a part of the plurality of copper layers on a second side of the magnetic core element.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
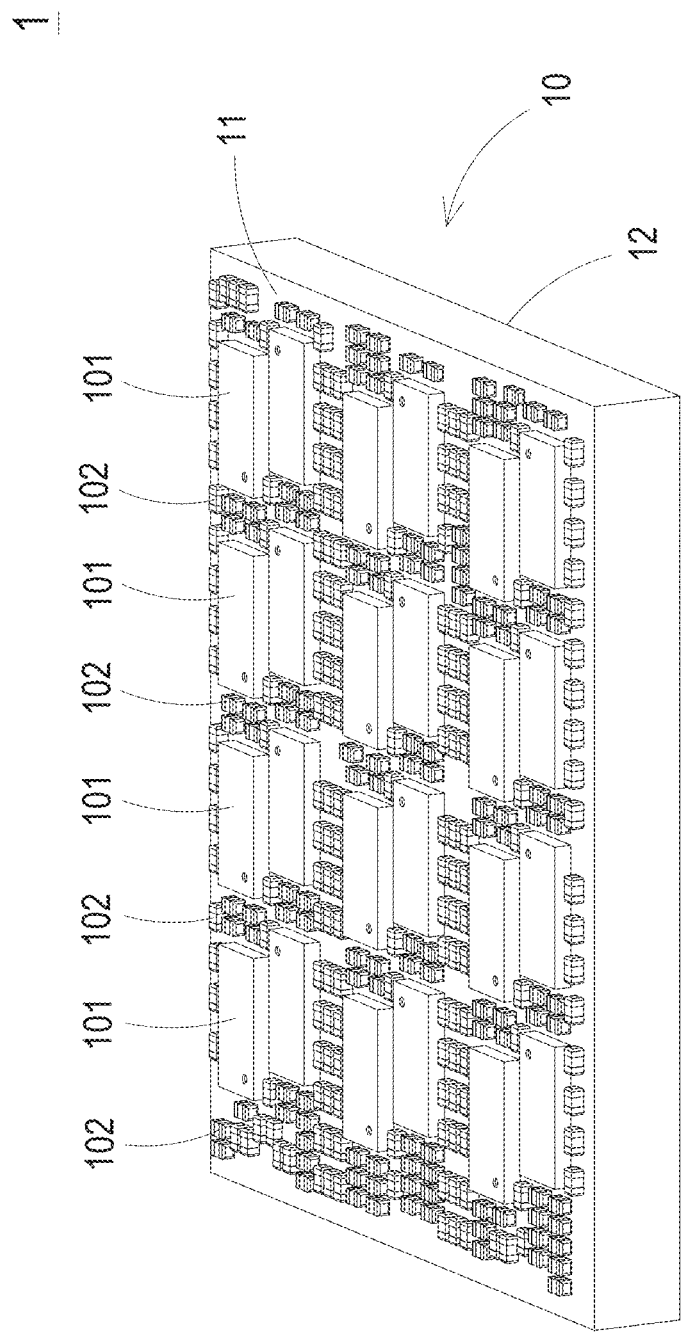
FIG. 1 is a schematic perspective view illustrating a power converter module according to an embodiment of the present disclosure.
Figure 2:
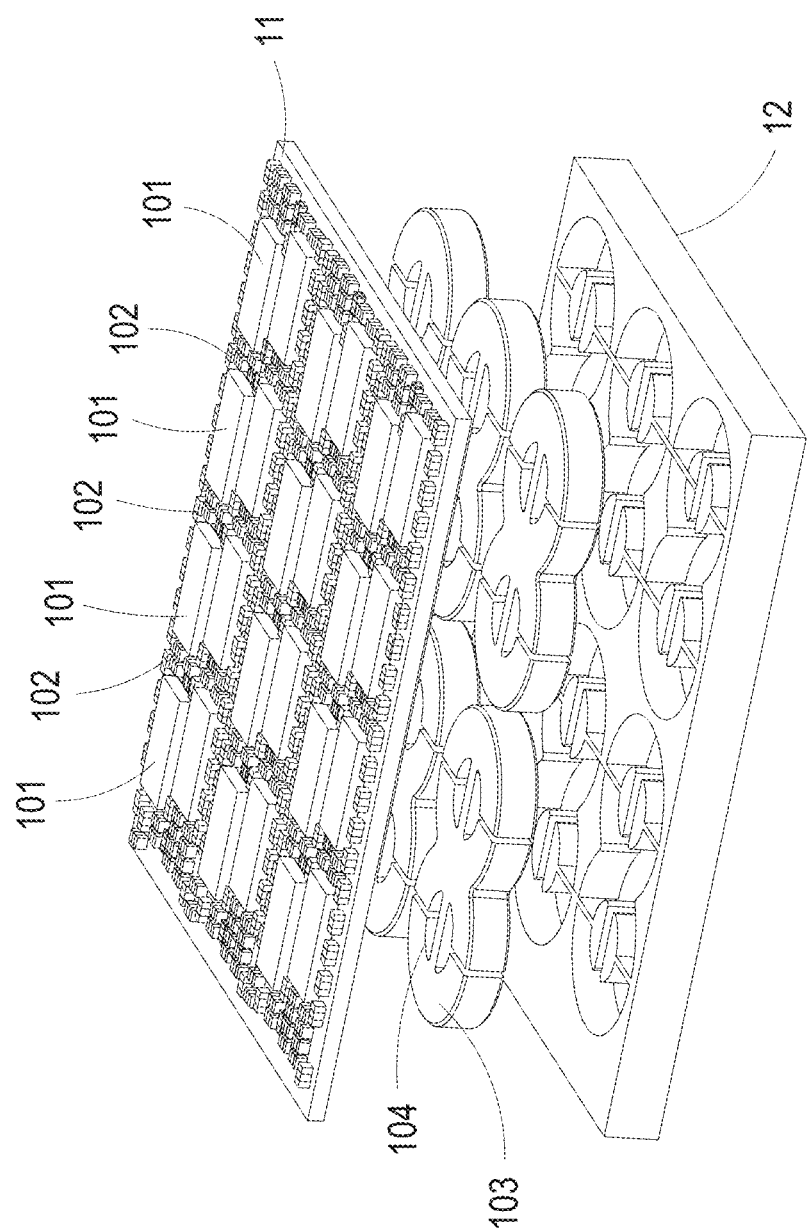
FIG. 2 is an exploded view illustrating the power converter module according to the embodiment of the present disclosure.
Figure 3:
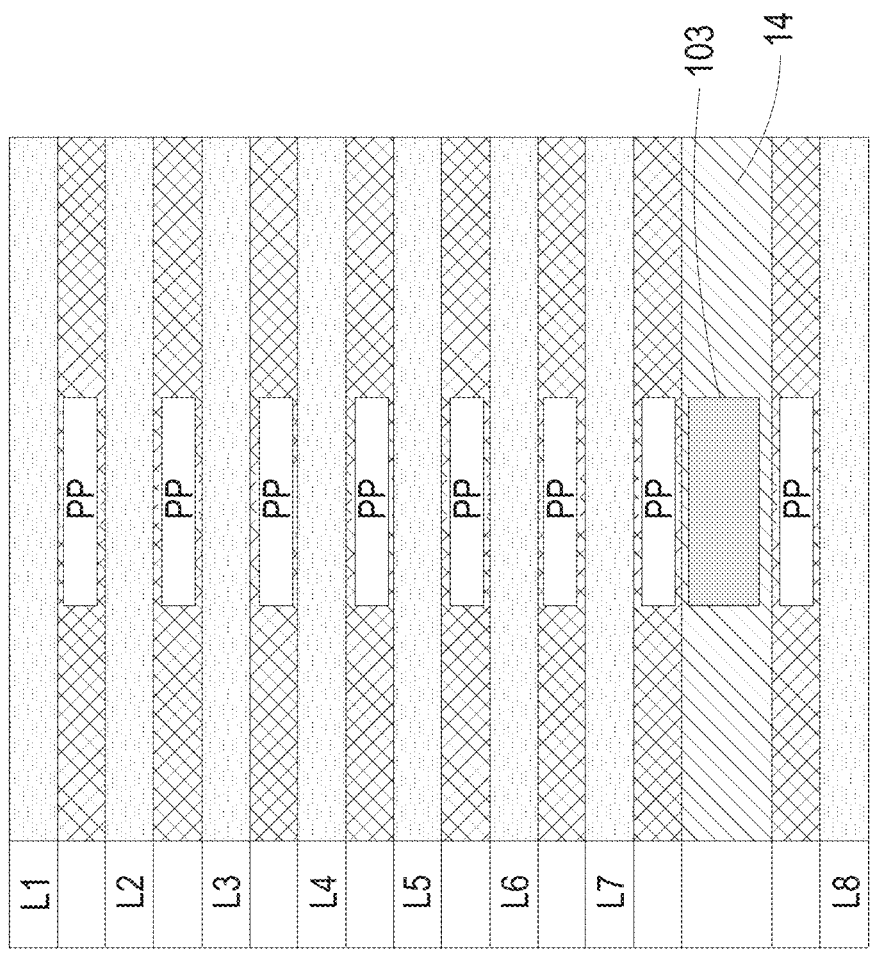
FIG. 3 is a schematic side view illustrating the power converter module according to the embodiment of the present disclosure.
Figure 4:
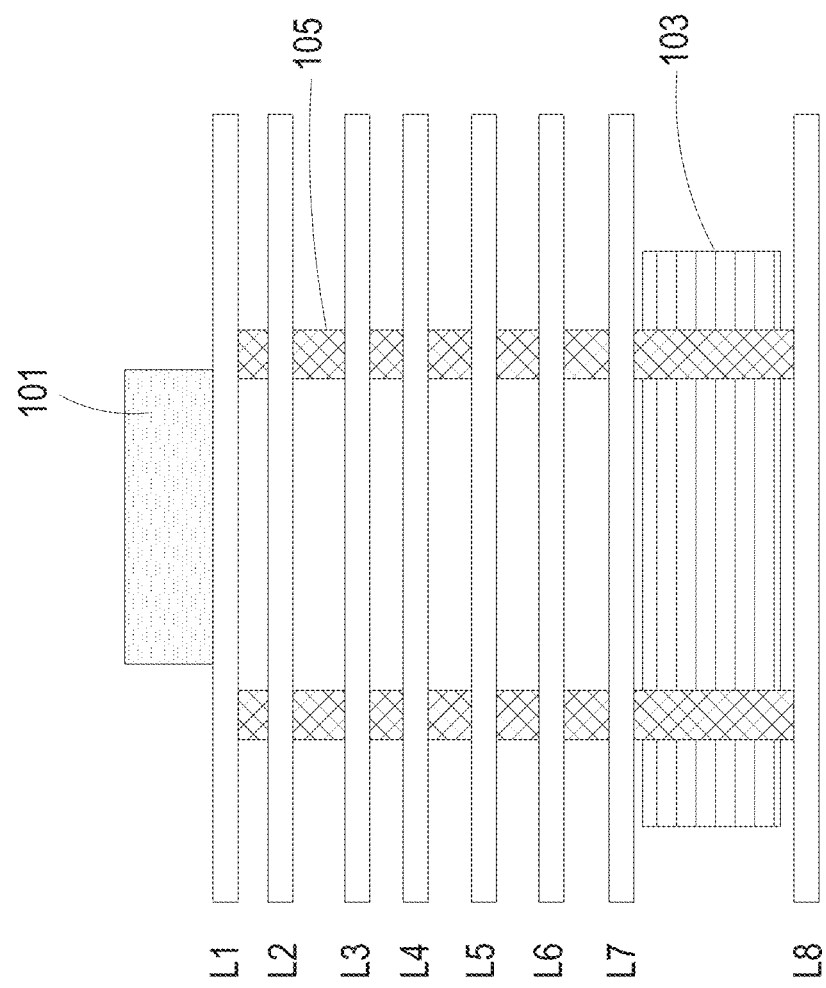
FIG. 4 is a schematic side view illustrating the power converter module according to the embodiment of the present disclosure.

FIG. 1 is a schematic perspective view illustrating a power converter module according to an embodiment of the present disclosure. FIG. 2 is an exploded view illustrating the power converter module according to the embodiment of the present disclosure. FIG. 3 is a schematic side view illustrating the power converter module according to the embodiment of the present disclosure. FIG. 4 is a schematic side view illustrating the power converter module according to the embodiment of the present disclosure. As shown in FIGS. 1, 2, 3, and 4, the power converter module 1 includes a multilayer printed circuit board 10, at least one switching device 101, at least one capacitor device 102, at least one magnetic core element 103 and at least one winding via 105. The multilayer printed circuit board 10 has a first surface 11, a second surface 12 and an inside layer 14. The first surface 11 and the second surface 12 are opposite, and the multilayer printed circuit board 10 includes a plurality of copper layers L1 to L8. The switching device 101 is disposed on the first surface 11 of the multilayer printed circuit board 10. The magnetic core element 103 is disposed in the inside layer 14 of the multilayer printed circuit board 10, and the magnetic core element 103 has at least one hole 104. A first end of the winding via 105 is electrically connected to the switching device 101, and a second end of the winding via 105 is electrically connected to the second surface 12 of the multilayer printed circuit board 10. The winding via 105 penetrates through the hole 104 of the magnetic core element 103 and forms a magnetic assembly with the magnetic core element 103. The winding via 105 is electrically connected to all or a part of the copper layers L1 to L8. The capacitor device 102 is disposed on the first surface 11 of the multilayer printed circuit board 10. The capacitor device 102 includes at least one capacitor, and the capacitor is an input capacitor or an output capacitor. In an embodiment, the winding via 105 is a straight hole or a stepped hole, more specifically, the winding via 105 may have a straight structure or a partially bent structure. The amount of the copper layers on a first side of the magnetic core element 103 close to the first surface 11 of the multilayer printed circuit board 10 is at least two more than the amount of the copper layers on a second side of the magnetic core element 103. In an embodiment, the amount of the copper layers on the first side of the magnetic core element 103 close to the first surface 11 of the multilayer printed circuit board 10 is at least three more than the amount of the copper layers on the second side of the magnetic core element 103. As shown in FIGS. 3 and 4, the multilayer printed circuit board 10 includes eight copper layers L1 to L8 and eight dielectric layers PP. The dielectric layer PP is disposed between the two adjacent copper layers, however, the actual amount of the layers of the multilayer printed circuit board 10 is not limited thereto. In an embodiment, the magnetic core element 103 is disposed between the copper layers L7 and L8 of the multilayer printed circuit board 10. As a result, the amount of the copper layers L1 to L7 on the first side of the magnetic core element 103 close to the first surface 11 of the multilayer printed circuit board 10 is more than the amount of the copper layer L8 on the other second side of the magnetic core element 103, and the copper layers L1 to L7 can have a larger wiring area and a larger copper laying area. Since the amount of the copper layers on one side of the magnetic core element 103 is more than the amount of the copper layers on the other side of the magnetic core element 103 (e.g., by two), a larger amount of copper layers concentrated on one side of the magnetic core element 103 can be used to obtain a larger wiring area and a larger copper laying area. Accordingly, enough space for wiring is provided to avoid the strong electromagnetic field interference caused by the power loop. Moreover, the flexibility of the copper laying network is increased, and the parasitic resistance and parasitic inductance of the multilayer printed circuit board are reduced, thereby improving the efficiency of power converter module.

Figure 5:
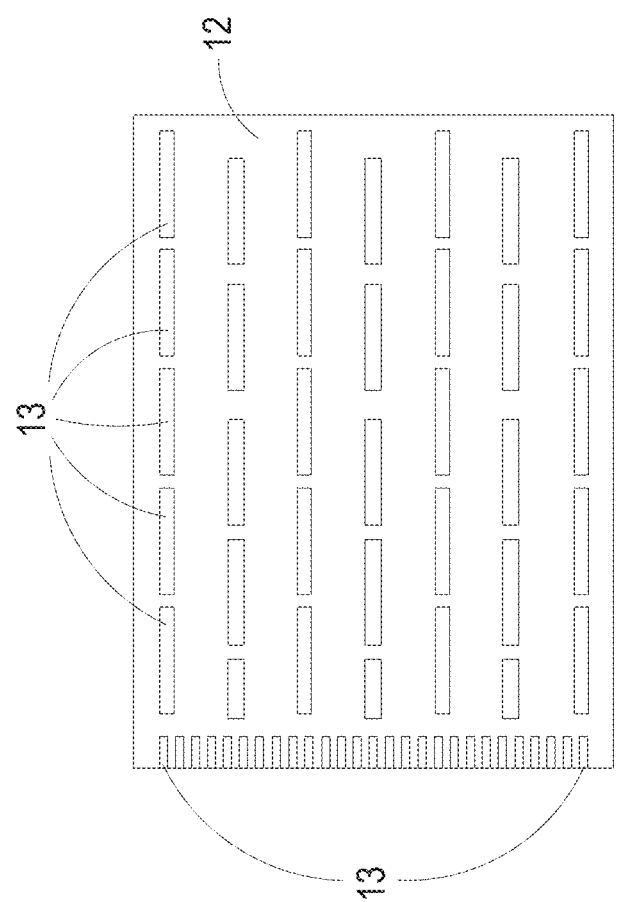
FIG. 5 is a schematic view illustrating the second surface of the power converter module according to the embodiment of the present disclosure.

FIG. 5 is a schematic view illustrating the second surface of the power converter module according to the embodiment of the present disclosure. In an embodiment, as shown in FIG. 5, the power converter module 1 further includes at least one pad 13, and the at least one pad 13 is disposed on the second surface 12 of the multilayer printed circuit board 10. The pad 13 is a copper block pin or the surface copper skin of the multilayer printed circuit board 10. The pad 13 is fixed on the second surface 12, and the second end of the winding via 105 is electrically connected to the pad 13.

Figure 6:
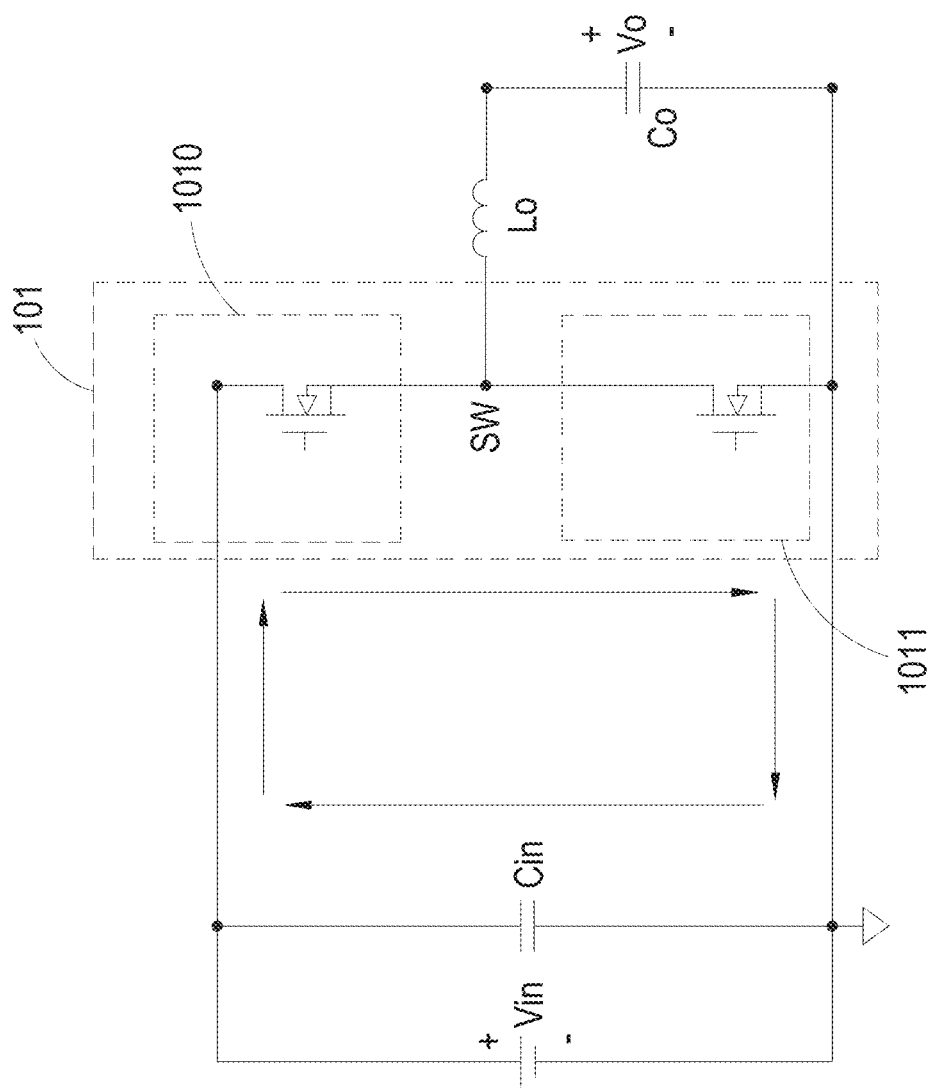
FIG. 6 is a schematic equivalent circuit diagram illustrating the power converter module of the present disclosure.

FIG. 6 is a schematic equivalent circuit diagram illustrating the power converter module of the present disclosure. As shown in FIG. 6, the capacitor device 102 includes an input capacitor Cin and an output capacitor Co, the magnetic assembly is an inductor Lo, and the winding via 105 is served as the winding of the inductor Lo. The switching device 101 includes at least one upper switch 1010 and at least one lower switch 1011 electrically connected to each other. The upper switch 1010 and the lower switch 1011 can be, for example, MOSFET (Metal Oxide Semiconductor Field Effect Transistor), but not limited thereto. A node SW is formed between the upper switch 1010 and the lower switch 1011, the node SW is electrically connected to the inductor Lo, and the node SW is electrically connected to the first end of the winding via 105. An end of the input capacitor Cin is electrically connected to the upper switch 1010 to form a positive input Vin+, the other end of the input capacitor Cin is electrically connected to the lower switch 1011 to form a negative input Vin−. Two ends of the output capacitor Co are connected to the inductor Lo and lower switch 1011, respectively. In an embodiment, the inductor Lo is regarded as the magnetic assembly of the above embodiment and is disposed in the inside layer 14 of the multilayer printed circuit board 10. The projections of the inductor Lo and the switching device 101 on the first surface 11 at least partially overlap with each other. The inductor Lo is electrically connected to the positive output Vo+ of the power converter module 1, and the positive output Vo+ is disposed on the second surface 12 of the multilayer printed circuit board 10. It is noted that only single-phase half-bridge branch is shown in FIG. 6, however, the actual power converter module may include multiple-phase half-bridge branches connected in parallel.

Figure 7:
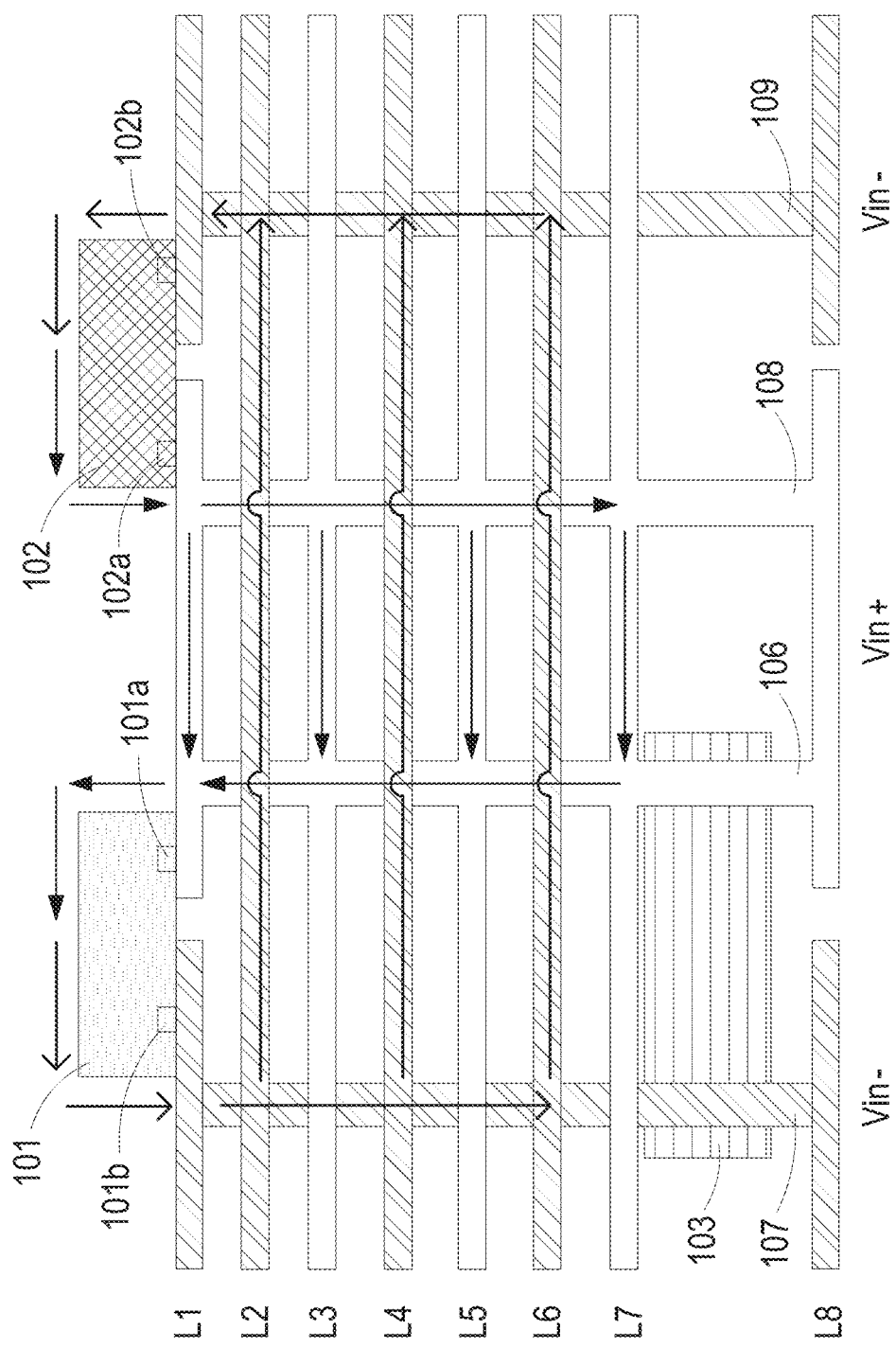
FIG. 7 is a schematic side view illustrating the power converter module according to another embodiment of the present disclosure.

FIG. 7 is a schematic side view illustrating the power converter module according to another embodiment of the present disclosure. The elements of FIG. 7 that are similar with those of FIG. 4 are represented by the same reference numerals, and the detailed description thereof is omitted herein. In the embodiment shown in FIG. 7, the plurality of copper layers include a plurality of positive copper layers and a plurality of negative copper layers, and the plurality of positive copper layers and the plurality of negative copper layers are disposed in staggered arrangement. In an embodiment, the positive copper layers include copper layers L3, L5, and L7, and the negative copper layers include copper layers L2, L4, and L6. The switching device 101 has a switching positive terminal 101a and a switching negative terminal 101b. The capacitor device 102 has a capacitor positive terminal 102a and a capacitor negative terminal 102b. The capacitor device 102 is disposed on the first surface 11 and is adjacent to the switching device 101, and the capacitor device 102 forms a capacitor area. The power converter module 1 further includes a first via 106, a second via 107, a third via 108 and a fourth via 109. The first via 106 is electrically connected to the switching positive terminal 101a, the second via 107 is electrically connected to the switching negative terminal 101b, the third via 108 is electrically connected to the capacitor positive terminal 102a, and the fourth via 109 is electrically connected to the capacitor negative terminal 102b. The first via 106 and the third via 108 are electrically connected to a part of the copper layer L1 (i.e., the part of the copper layer L1 that is electrically connected to the switching positive terminal 101a and the capacitor positive terminal 102a), the copper layers L3, L5, L7, and a part of the copper layer L8 (i.e., the part of the copper layer L8 that is electrically connected to the positive input Vin+). The second via 107 and the fourth via 109 are electrically connected to a part of the copper layer L1 (i.e., the part of the copper layer L1 that is electrically connected to the switching negative terminal 101b and the capacitor negative terminal 102b), the copper layers L2, L4, L6, and a part of the copper layer L8 (i.e., the part of the copper layer L8 that is electrically connected to the negative input Vin−). The positive copper layers and the negative copper layers are disposed in staggered arrangement. The first via 106 and the third via 108 are electrically connected to the positive input Vin+, and the second via 107 and the fourth via 109 are electrically connected to the negative input Vin−. The positive input Vin+ and the negative input Vin− are disposed on the second surface 12 of the multilayer printed circuit board 10. The arrow line in FIG. 7 represents the direction of the AC current of this embodiment. The AC current loop of this embodiment is exemplified as follows. Taking the capacitor positive terminal 102a of the capacitor device 102 as a starting point, the AC current flows through the third via 108 and each positive copper layer, and then flows into the switching positive terminal 101a of the switching device 101 through the first via 106. Taking the switching negative terminal 101b of the switching device 101 as a starting point, the AC current flows through the second via 107 and each negative copper layer, and then flows into the capacitor negative terminal 102b of the capacitor device 102 through the fourth via 109. The direction of the AC current flowing through the positive copper layer is opposite to the direction of the AC current flowing through the adjacent negative copper layer. The overlapping parts of the first and third vias 106 and 108 and the copper layers L2, L4, and L6 shown in FIG. 7 only represent the front-to-rear relationship between the via and the copper layer under this viewing angle condition, rather than the actual connection. Similarly, the overlapping parts of the second and fourth vias 107 and 109 and the copper layers L3, L5, and L7 only represent the front-to-rear relationship between the via and the copper layer under this viewing angle condition, rather than the actual connection. The AC current flowing through the adjacent copper layers are in opposite directions so that the AC magnetic fluxes between the adjacent copper layers cancel each other out, thereby reducing the parasitic inductance of the current loop. Consequently, the conversion efficiency of the power conversion module is improved.

In addition, the power converter module 1 further includes a dielectric layer PP, and the dielectric layer PP is disposed between two adjacent copper layers. The projections of the adjacent positive and negative copper layers and the capacitor area on the first surface 11 at least partially overlap with each other, thereby reducing the parasitic inductance of wiring and reducing the parasitic loss. Therefore, the conversion efficiency of the power converter module 1 is improved. In an embodiment, the first via 106, the second via 107, the third via 108, and the fourth via 109 are straight holes or stepped holes.

In an embodiment, a part of the copper layer L8 is electrically connected to the positive output of the power converter 1, and a part of the copper layer L8 is electrically connected to the negative output of the power converter module 1.

In an embodiment, when the amount of the positive copper layer on the side of the magnetic core element 103 is one, and the amount of the negative copper layer is also one, the amount of the copper layers on one side of the magnetic core element 103 is two more than the amount of the copper layers on the other side of the magnetic core element 103.

It should be noted that the side view shown in FIG. 4 focuses on showing the position and connection relationships of the copper layers, the magnetic core element and the corresponding winding via. The side view shown in FIG. 7 focuses on showing the electrical connections of the positive and negative copper layers, the switching device and the capacitor device. In fact, the structures shown in FIGS. 4 and 7 can be implemented in different power converter modules or in the same power converter module.

From the above descriptions, the present application provides a power converter module. The amount of the copper layers on one side of the magnetic core element is more than the amount of the copper layers on the other side of the magnetic core element. Therefore, a larger amount of copper layers concentrated on one side of the magnetic core element can be used to obtain a larger wiring area and a larger copper laying area. Accordingly, enough space for wiring is provided to avoid the strong electromagnetic field interference caused by the power loop. Moreover, the flexibility of the copper laying network is increased, and the parasitic resistance and parasitic inductance of the multilayer printed circuit board are reduced, thereby improving the efficiency of power converter module. The present application provides a power converter module, by staggering the plurality of positive copper layers and the plurality of negative copper layers, and the plurality of positive copper layers and the plurality of negative copper layers are electrically connected to the corresponding switching positive and negative terminals, the capacitor positive and negative terminals, and a plurality of vias respectively. The projections of the adjacent positive and negative copper layers and the capacitor area on the first surface at least partially overlap with each other, thereby reducing the parasitic inductance of the wiring and reducing the parasitic loss. Therefore, the conversion efficiency of the power conversion module is improved.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power converter module, comprising:
   a multilayer printed circuit board, wherein the multilayer printed circuit board has a first surface, a second surface and an inside layer, the first surface and the second surface are opposite, and the multilayer printed circuit board comprises a plurality of copper layers;
   at least one switching device disposed on the first surface of the multilayer printed circuit board;
   at least one magnetic core element disposed in the inside layer of the multilayer printed circuit board, wherein the magnetic core element has at least one hole; and at least one winding via, wherein a first end of the winding via is electrically connected to the switching device, and a second end of the winding via is electrically connected to the second surface of the multilayer printed circuit board, and the winding via penetrates through the hole of the magnetic core element and forms a magnetic assembly with the magnetic core element;

wherein an amount of a part of the plurality of copper layers on a first side of the magnetic core element close to the first surface of the multilayer printed circuit board is at least two more than an amount of a part of the plurality of copper layers on a second side of the magnetic core element;

wherein the plurality of copper layers are configured for circuit wiring, wherein the power converter module further comprises a capacitor device, wherein the capacitor device is disposed on the first surface of the multilayer printed circuit board and comprises at least on capacitor, and the at least one capacitor is an input capacitor or an output capacitor, wherein the switching device and the capacitor device are electronically connected though the part of the plurality of copper layers on the first side.

2. The power converter module according to claim 1, wherein the amount of the part of the plurality of copper layers on the first side of the magnetic core element close to the first surface of the multilayer printed circuit board is at least three more than the amount of the part of the plurality of copper layers on the second side of the magnetic core element.

3. The power converter module according to claim 1, further comprising at least one pad, wherein the pad is disposed on the second surface of the multilayer printed circuit board, and the second end of the winding via is electrically connected to the pad.

4. The power converter module according to claim 3, wherein the pad is a copper block pin or a surface copper skin of the multilayer printed circuit board, and the pad is fixed on the second surface.

5. The power converter module according to claim 1, wherein the winding via is electrically connected to all or a part of the plurality of copper layers.

6. The power converter module according to claim 1, wherein the winding via is a straight hole or a stepped hole.

7. The power converter module according to claim 1, wherein the magnetic assembly forms an inductor.

8. The power converter module according to claim 1, wherein the switching device comprises at least one upper switch and at least one lower switch electrically connected to each other, wherein a node is formed between the upper switch and the lower switch, and the node is electrically connected to the first end of the winding via.

9. The power converter module according to claim 1, wherein the plurality of copper layers comprises a plurality of positive copper layers and a plurality of negative copper layers, the plurality of positive copper layers and the plurality of negative copper layers are disposed in staggered arrangement, and a direction of a current flowing through each of the plurality of positive copper layers is opposite to a direction of a current flowing through the adjacent negative copper layer.

10. The power converter module according to claim 9, further comprising at least one first via, at least one second via, at least one third via and at least one fourth via, wherein the first via is electrically connected to a switching positive terminal of the switching device, the second via is electrically connected to a switching negative terminal of the switching device, the third via is electrically connected to a capacitor positive terminal of the capacitor device, and the fourth via is electrically connected to a capacitor negative terminal of the capacitor device, wherein the plurality of positive copper layers are electrically connected to the first via and the third via, and the plurality of the negative copper layers are electrically connected to the second via and the fourth via.

* * * * *